United States Patent
Aruga

(10) Patent No.: US 9,083,371 B2
(45) Date of Patent: Jul. 14, 2015

(54) CAPACITIVE ELEMENT, CAPACITOR ARRAY, AND A/D CONVERTER

(71) Applicant: FUJITSU SEMICONDUCTOR LIMITED, Yokohama, Kanagawa (JP)

(72) Inventor: Kenta Aruga, Akishima (JP)

(73) Assignee: SOCIONEXT INC., Yokohama (JP)

(*) Notice: Subject to any disclaimer, the term of this patent is extended or adjusted under 35 U.S.C. 154(b) by 0 days.

(21) Appl. No.: 14/066,291

(22) Filed: Oct. 29, 2013

(65) Prior Publication Data

US 2014/0167992 A1 Jun. 19, 2014

(30) Foreign Application Priority Data

Dec. 17, 2012 (JP) ................. 2012-274747

(51) Int. Cl.
*H03M 1/12* (2006.01)
*H01G 4/38* (2006.01)
*H01G 4/012* (2006.01)

(52) U.S. Cl.
CPC ............ *H03M 1/12* (2013.01); *H01G 4/012* (2013.01); *H01G 4/38* (2013.01)

(58) Field of Classification Search
CPC ............................. H03M 1/466; H03M 1/806
USPC .......................... 341/155, 172, 150
See application file for complete search history.

(56) References Cited

U.S. PATENT DOCUMENTS

| | | | |
|---|---|---|---|
| 3,060,392 A * | 10/1962 | Ciancarelli | 333/182 |
| 3,289,015 A * | 11/1966 | Fitch et al. | 307/110 |
| 4,914,546 A | 4/1990 | Alter | |
| 5,208,725 A | 5/1993 | Akcasu | |
| 5,220,483 A | 6/1993 | Scott | |
| 5,583,359 A | 12/1996 | Ng et al. | |
| 6,016,019 A * | 1/2000 | Wojewoda | 307/109 |
| 6,066,537 A | 5/2000 | Poh | |
| 6,312,986 B1 * | 11/2001 | Hermes | 438/254 |
| 6,737,698 B1 | 5/2004 | Paul et al. | |
| 8,640,529 B2 * | 2/2014 | Sinha | 73/61.45 |
| 8,675,336 B2 * | 3/2014 | Lavene et al. | 361/274.1 |
| 2006/0226496 A1 * | 10/2006 | Juengling | 257/387 |
| 2007/0115159 A1 | 5/2007 | Tachibana et al. | |
| 2008/0173912 A1 * | 7/2008 | Kumura et al. | 257/295 |
| 2008/0237677 A1 * | 10/2008 | Futatsugi | 257/312 |
| 2009/0044627 A1 * | 2/2009 | Brady | 73/643 |
| 2009/0261444 A1 * | 10/2009 | Yamazaki et al. | 257/459 |

(Continued)

FOREIGN PATENT DOCUMENTS

| | | |
|---|---|---|
| JP | 05-090489 A | 4/1993 |
| JP | 2005-108874 A | 4/2005 |

(Continued)

OTHER PUBLICATIONS

Bernhard E. Boser et al., "The Design of Sigma-Delta Modulation Analog-to-Digital Converters", IEEE Journal of Solid-State Circuits, Dec. 1988, pp. 1298-1308, vol. 23, No. 6.

(Continued)

*Primary Examiner* — Linh Nguyen
(74) *Attorney, Agent, or Firm* — Arent Fox LLP

(57) ABSTRACT

A capacitive element includes first electrodes and second electrodes that are alternately arranged in a concentric form. Each of the first electrodes and the second electrodes is formed with closed loop form, in at least one wiring layer provided on or above a substrate.

19 Claims, 10 Drawing Sheets

(56) References Cited

U.S. PATENT DOCUMENTS

| | | | |
|---|---|---|---|
| 2009/0288869 A1* | 11/2009 | Anderson et al. | 174/261 |
| 2010/0117485 A1* | 5/2010 | Martin et al. | 310/319 |
| 2011/0303957 A1* | 12/2011 | Juengling | 257/306 |
| 2012/0013354 A1* | 1/2012 | Bowler et al. | 324/664 |
| 2012/0056770 A1* | 3/2012 | Araki et al. | 341/172 |

FOREIGN PATENT DOCUMENTS

| | | |
|---|---|---|
| JP | 2005-197396 A | 7/2005 |
| JP | 2007-081044 A | 3/2007 |
| JP | 2007-142863 A | 6/2007 |
| JP | 2009-278078 A | 11/2009 |
| JP | 2010-272800 A | 12/2010 |

OTHER PUBLICATIONS

Hae-Seung Lee et al., "A Self-Calibrating 15 Bit CMOS A/D Converter", IEEE Journal of Solid-State Circuits, Dec. 1984, pp. 813-819, vol. Sc-19, No. 6.

Kare Tais Christensen, "Design and Characterization of Vertical Mesh Capacitors in Standard CMOS", 2001 Symposium on VLSI Circuits Digest of Technical Papers, 2001, pp. 201-204.

Roberto Aparicio et al., "Capacity Limits and Matching Properties of Integrated Capacitors", IEEE Journal of Solid-State Circuits, Mar. 2002, vol. 37, No. 3.

* cited by examiner

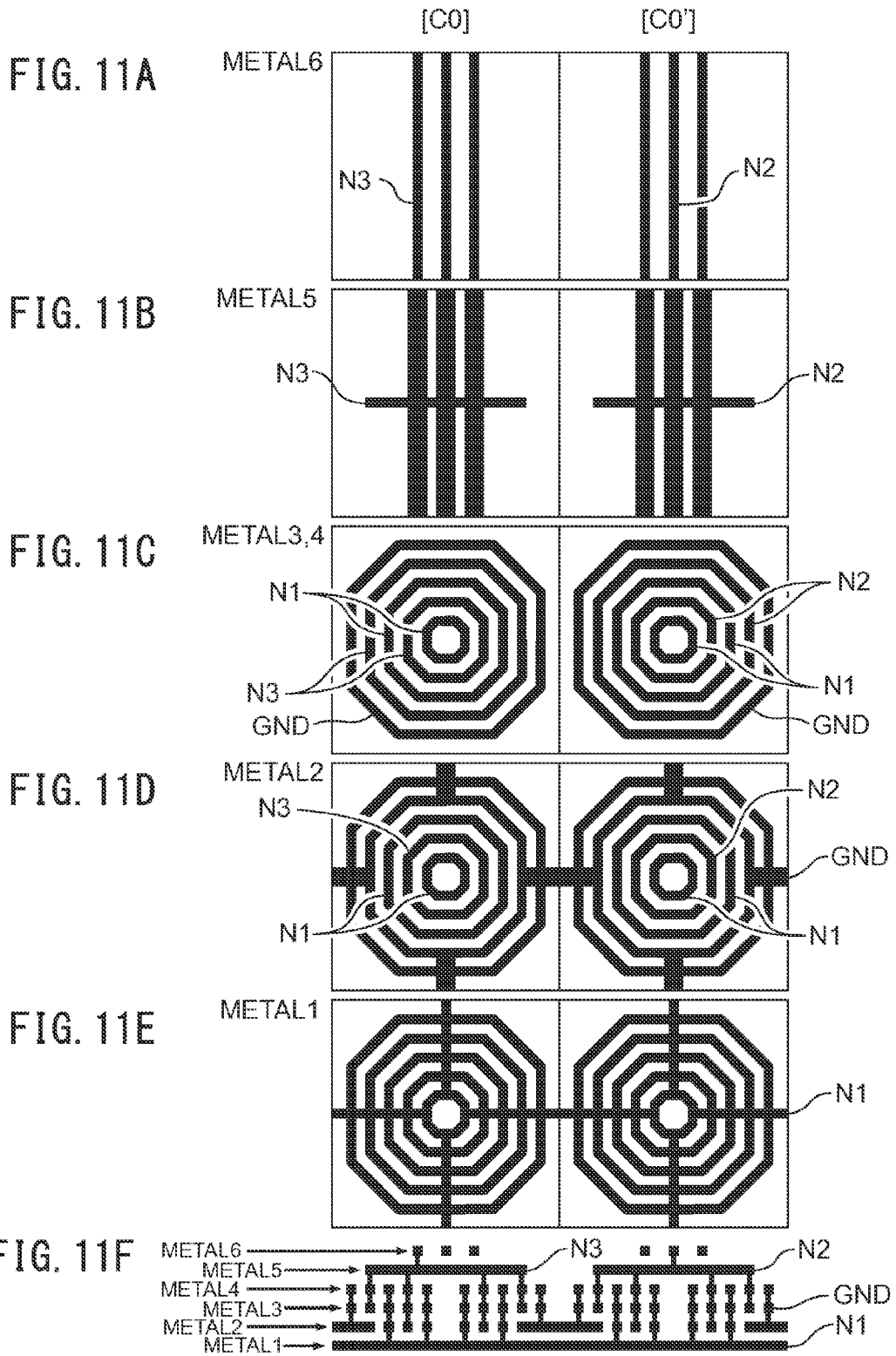

CAPACITIVE ELEMENT, CAPACITOR ARRAY, AND A/D CONVERTER

CROSS-REFERENCE TO RELATED APPLICATION

This application is based upon and claims the benefit of priority of the prior Japanese Patent Application No. 2012-274747, filed on Dec. 17, 2012, the entire contents of which are incorporated herein by reference.

FIELD

The embodiments discussed herein are related to a capacitive element, a capacitor array, and an A/D converter.

BACKGROUND

In recent years, A/D converters are broadly utilized in various fields. More specifically, a successive approximation A/D converter and a delta-sigma A/D converter are known as A/D converters with relatively high resolution. Such A/D converters include a switched-capacitor circuit, for example, and are widely used in the form of CMOS (Complementary Metal Oxide Semiconductor) integrated circuit.

As performance indexes of an A/D converter, there are linearity, an offset, and a gain error, for example. However, the advantage in the conversion characteristic of an A/D converter is largely under the control of a matching, the voltage dependence or the like of a capacitive element in many cases. Therefore, in order to realize an A/D converter with high conversion accuracy, it is preferred to apply capacitive elements with good characteristics.

Such a capacitive element with good characteristics is not limited to be applied to an A/D converter, but, for example, it may be broadly applied also to various electronic circuits including a circuit for measuring instruments.

[About Successive Approximation A/D Converter]

First, a successive approximation A/D converter will be illustrated. A successive approximation A/D converter includes an internal D/A converter (Digital-to-Analog Converter: capacitor DAC), a comparator, and a digital circuit for a successive approximation control.

The successive approximation A/D converter obtains an A/D conversion result by sampling an input analog voltage, comparing the input analog voltage with an output voltage of the capacitor DAC, and searching an output of the capacitor DAC where the two voltages match most closely.

The differential nonlinearity (DNL) of the successive approximation A/D converter is decided according to the matching of the capacitive elements included in the capacitor DAC. Then, when the matching of the capacitive elements is inferior, a code loss, which lacks a part of staircase-shaped transfer characteristic, occurs.

Moreover, the integral nonlinearity (INL) of the successive approximation A/D converter is decided according to the voltage dependence of the capacitive elements included in the capacitor DAC. When the capacitive element includes the voltage dependence, A/D conversion characteristics become nonlinear since a capacitance value changes with voltage across the capacitive element, and this may be a cause of deformation.

Hitherto, self-calibration techniques are proposed as a method of solving a problem of a capacitor mismatch in a successive approximation A/D converter. The self-calibration techniques add a self-calibration circuit including a capacitor DAC to carry out individual calibration after manufacturing (refer to Non-Patent Document 1, for example).

Using the self-calibration techniques eases an influence of the mismatch of capacitive elements to some extent. However, as for the capacitor DAC included in a self-calibration circuit, the larger a mismatch is, the more a circuit scale increases, which causes a circuit area and a manufacturing cost to increase. Accordingly, it remains preferable to have a lower mismatch of capacitive elements.

Moreover, hitherto, a method is proposed by which a capacitor DAC is made to be a differential structure in order to ease an influence of the voltage dependence of a capacitive element, and the voltages applied to the capacitor DAC on positive side and negative side is made to be the same voltage at a step of sampling and a step of comparing (refer to Patent Document 1, for example).

By employing the above-mentioned constitution, it is possible to cancel a first-order term of the voltage dependence of a capacitive element, and to improve the linearity of an A/D conversion. However, since the terms equal to or higher than second order of the voltage dependence of a capacitive element still remain, the linearity of an A/D conversion receives an influence.

[About Delta-Sigma A/D Converter]

Next, a delta-sigma A/D converter will be illustrated. A delta-sigma A/D converter includes a delta sigma modulator and a digital circuit which performs signal processing.

The delta sigma modulator performs a delta-sigma modulation on an input signal, and transfers a digital signal to a latter digital circuit. The digital circuit extracts desired information from a delta-sigma modulated digital signal, and outputs the information as an A/D conversion result.

A typical delta sigma modulator is realized by a switched capacitor, and includes a sampling circuit, an adding and subtracting circuit, an integrating circuit, and a capacitor DAC. To these components, capacitive elements, such as sampling capacitors, reference capacitors, and integral capacitors, are applied (refer to Non-Patent Document 2, for example).

By the way, in a delta-sigma A/D converter with a 1-bit capacitor DAC, the capacitor DAC only outputs a binary, and therefore, the mismatch of capacitive elements does not directly affect linearity.

However, the mismatch between a sampling capacitor and a reference capacitor affects the offset, and in addition, a mismatch among three capacitances of a sampling capacitor, a reference capacitor, and an integral capacitor affects a gain error. In other words, in order to make the offset and the gain error small, it is desirable to increase the relative accuracy of a capacitive element.

In a delta-sigma A/D converter, the voltage dependence of a capacitance value of a capacitive element affects the linearity of an A/D conversion. It is difficult for a delta-sigma A/D converter which includes a typical structure to make voltage applied to a capacitive element the same voltage at a step of sampling and a step of integrating.

Therefore, a delta-sigma A/D converter requires a capacitive element with even lower voltage dependence in comparison with a successive approximation A/D converter with similar degree of resolution.

In this way, it can be understood that the accuracy of an A/D converter highly depends on the characteristics of a capacitive element, as for a successive approximation A/D converter or a delta-sigma A/D converter.

[About Capacitive Element in Integrated Circuit]

There are a parallel plate structure and a comb-shaped structure as structures of a capacitive element used for an A/D converter with relatively high resolution. The electric field between electrodes seen from a wafer cross-section is a lengthwise direction for the parallel plate structure, and a horizontal direction for the comb-shaped structure.

As capacitive elements for the parallel plate structure, PIP (Poly Insulator Poly), MIM (Metal Insulator Metal), and a structure in which wiring layers are arranged in a comb shape are known. The PIP capacitor is the one which has the parallel plate structure and uses polysilicon for an upper electrode and a lower electrode (refer to Patent Document 2, for example).

In an electrode of the PIP capacitor, a high-concentration semiconductor part which is not an ideal conductor remains even though the surface may be silicidated. Therefore, when a potential difference occurs between terminals, a surface potential of the electrode changes slightly.

In a typical manufacturing process, about 50 ppm/v of the first-order voltage coefficient of a capacitance remains, for example. Therefore, when it is applied to the A/D converter with high resolution, linearity may be damaged and there is a possibility to generate a distortion in the conversion result.

Further, since the PIP capacitor is formed of two-layer polysilicon, there is a problem that a manufacturing cost increases. In other words, a typical MOS process uses at least one layer of polysilicon for gate formation of a transistor, but one more layer of polysilicon is to be used only for forming a capacitive element is added, which causes the increase in a manufacturing cost.

On the other hand, a MIM capacitor has a parallel plate structure and has a structure using metal, such as aluminum, for an upper electrode and a lower electrode. As for the MIM capacitor, since the electrode is metal, there is an advantage that the voltage dependence is even smaller than the PIP capacitor, and generally, the capacitance to ground of a lower electrode is small in comparison with the PIP capacitor.

The MIM capacitor can be classified roughly into two kinds, one including the manufacturing process for forming the MIM capacitor, and the other diverting wiring layers. A manufacturing cost increases due to an additional manufacturing process in the former case, whereas an additional cost does not arise in the latter case since it is possible to form the MIM capacitor simultaneously with wiring (refer to Patent Documents 3 and 4, for example).

These capacitive elements having a parallel plate structure is widely used, when wiring material of an integrated circuit is aluminum.

In addition to above-mentioned capacitor structure, there is one of which wiring layer has a comb-shaped structure. In the recent CMOS manufacturing process, miniaturization of elements progresses and copper is used for a wiring material in many cases. The copper wiring has an advantage of lower interconnection resistance in comparison with aluminum interconnection and has high tolerance for an electromigration.

However, since the copper wiring uses a manufacturing process called a damascene, there is a fault that uniform formation becomes difficult when wiring with narrow width and wiring with wide width are mixed. Since a manufacturing process is optimized according to a copper wiring having minimum width, it is difficult to realize a parallel plate capacitance with a relatively large area. Therefore, when wiring material is copper, a comb-shaped structure is usually employed.

In the old days, a wiring pitch of an integrated circuit is large, and it was not realistic to use a horizontal-direction capacitive coupling as a capacitive element using an wiring layer since it causes an increase of an area of silicon.

However, miniaturization of an integrated circuit device has progressed over time, and a wiring pitch has been shrunk. As a result, capacitors with comb-shaped structure have come to be used widely (refer to Patent Documents 5 and 6, and Non-Patent Documents 3 and 4, for example).

Hitherto, a technique has been also proposed by which a planar shield electrode is provided in each of the uppermost layer and the undermost layer of wiring layers which form capacitors, and an electric field between the electrodes of a capacitive element is shielded, thereby preventing the capacitive coupling which is not intended (refer to Patent Documents 7 and 8, for example).

Hitherto, a technique has been also proposed by which wiring electrically connected to a terminal to which high power source potential is applied and wiring electrically connected to a terminal to which low power source potential is applied are formed so that both wirings are adjacent to each other through dielectric and surround an integrated circuit (refer to Patent Document 9, for example).

As mentioned above, it is preferred that the capacitive element to be applied to the A/D converters, such as the successive approximation A/D converter and the delta-sigma A/D converter, has sufficient relative precision and low voltage dependence to achieve a desired resolution. In order to achieve these requirements, any of a PIP capacitor, an MIM capacitor and a comb-shaped capacitor is used.

Among the capacitive elements, the PIP capacitor has a problem of not being able to be formed by a standard logic manufacturing process, requiring additional manufacturing steps, which increases a manufacturing cost. As for the MIM capacitor with parallel plate structure, there is a possibility to reduce a cost by forming electrodes simultaneously with an interconnecting process.

However, a parallel plate structure can be employed only when wiring material is aluminum, and it is difficult to form the structure by a copper wiring process. In other words, a comb-shaped capacitor is usually adopted in a copper wiring process in order to make a high resolution A/D converter without an additional manufacturing process. However, there are various problems in a comb-shaped capacitor as illustrated in detail below.

Patent Document 1: Japanese Laid-open Patent Publication No. 2007-142863
Patent Document 2: U.S. Pat. No. 4,914,546
Patent Document 3: U.S. Pat. No. 5,220,483
Patent Document 4: U.S. Pat. No. 6,066,537
Patent Document 5: U.S. Pat. No. 5,583,359
Patent Document 6: Japanese Laid-open Patent Publication No. 2005-108874
Patent Document 7: U.S. Pat. No. 6,737,698
Patent Document 8: Japanese Laid-open Patent Publication No. 2005-197396
Patent Document 9: Japanese Laid-open Patent Publication No. 2009-278078
Non-Patent Document 1: H. S. Lee et al., "A Self-Calibrating 15 Bit CMOS A/D Converter," IEEE Journal of Solid-State Circuits Vol. SC-19, No. 6, December 1984
Non-Patent Document 2: B. E. Boser et al., "The deisgn of sigma-delta modulation analog-to-digital converters," IEEE Journal of Solid-State Circuits, Vol. 23, pp. 1298-1308, December 1988
Non-Patent Document 3: K. T. Christensen, "Design and characterization of vertical mesh capacitors in standard CMOS," Symp. VLSI Technol., pp. 201-204, 2001
Non-Patent Document 4: Aparicio et al., "Capacity limits and matching properties of integrated capacitors," IEEE J. Solid-State Circuits, vol. 37, pp. 384-393, 2002

SUMMARY

According to an aspect of the embodiments, a capacitive element includes first electrodes and second electrodes that are alternately arranged in a concentric form, and each of the first electrodes and the second electrodes is formed with closed loop form, in at least one wiring layer provided on or above a substrate.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 11A, FIG. 11B, FIG. 11C, FIG. 11D, FIG. 11E, and FIG. 11F are drawings for illustrating the capacitive element depicted in FIG. 10;

DESCRIPTION OF EMBODIMENTS

Before describing embodiments of a capacitive element, a capacitor array, and an A/D converter in detail, examples of a capacitive element, a capacitor array, an A/D converter, and problems thereof will be illustrated in detail with reference to FIG. 1A to FIG. 5.

Figure 1A:
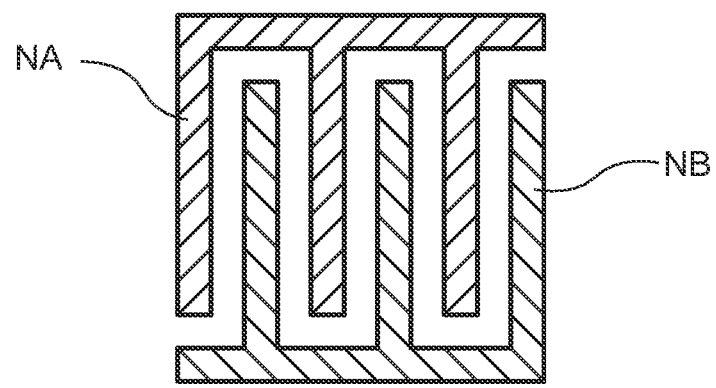
FIG. 1A and FIG. 1B are drawings depicting an example of a comb-shaped capacitive element.
Figure 1B:
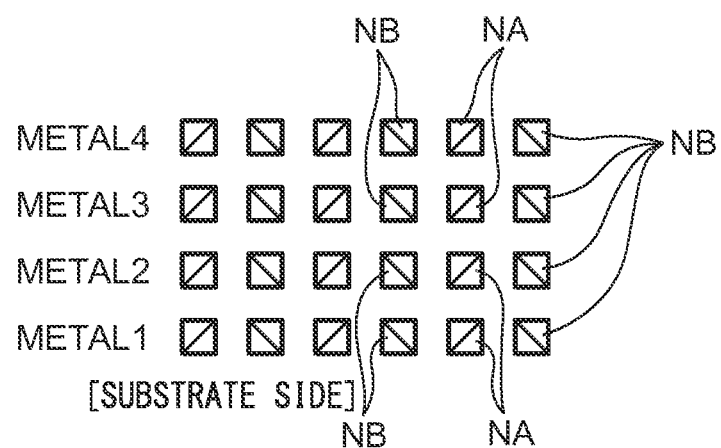

FIG. 1A and FIG. 1B are drawings depicting an example of a comb-shaped capacitive element. FIG. 1A depicts a top view, and FIG. 1B depicts a cross-sectional view. In FIG. 1A and FIG. 1B, reference mark NA indicates a first electrode (first node) of the capacitive element, NB indicates a second electrode (second node) of the capacitive element, and METAL1 to METAL4 indicate respective layers of wiring layers (metallic wiring layers).

In other words, as depicted in FIG. 1A, the first electrode(s) NA and the second electrode(s) NB are arranged alternately, and are capacitively coupled one another to form the capacitive element (the comb-shaped capacitive element). Moreover, as depicted in FIG. 1B, in order to increase capacitance per area, comb-shaped structures depicted in FIG. 1A are vertically layered in the comb-shaped capacitive element.

In other words, as depicted in FIG. 1B, the comb-shaped structures depicted in FIG. 1A are layered in a thickness direction of a substrate, so that an wiring layer METAL1 which is a first layer, an wiring layer METAL2 which is a second layer, an wiring layer METAL3 which is a third layer, and an wiring layer METAL4 which is a fourth layer are layered from a substrate side.

Figure 2A:
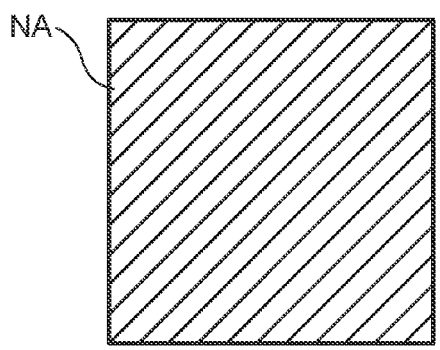
FIG. 2A, FIG. 2B, and FIG. 2C are drawings depicting another example of the comb-shaped capacitive element.
Figure 2B:
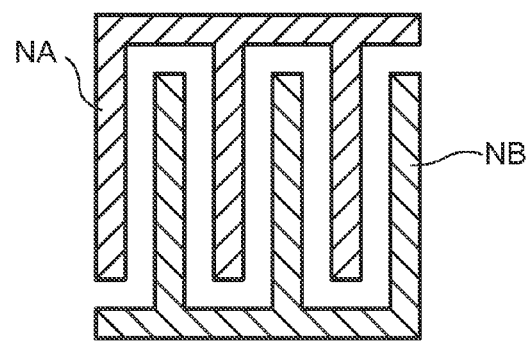
Figure 2C:
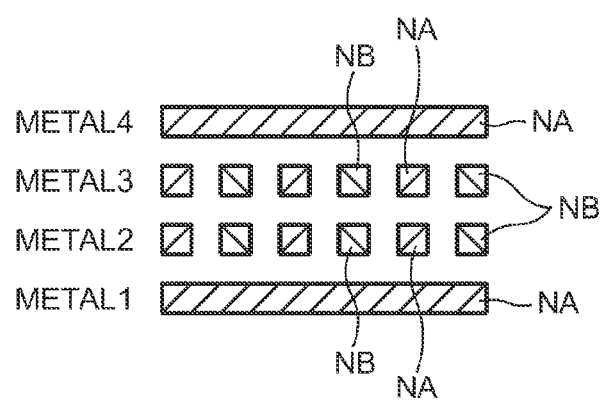

FIG. 2A, FIG. 2B, and FIG. 2C are drawings depicting another example of the comb-shaped capacitive element. FIG. 2A depicts a top view of METAL1 and METAL4, FIG. 2B depicts a top view of METAL2 and METAL3, and FIG. 2C depicts a cross-sectional view of the comb-shaped capacitive element.

The comb-shaped capacitive element depicted in FIG. 2A to FIG. 2C are provided with a shield layer for shielding an electric field. As depicted in FIG. 2A, planar shield electrodes (NA) are used as the uppermost layer (METAL4) and the undermost layer (METAL1) of the wiring layers which form the capacitor.

Note that, as depicted in FIG. 2B and FIG. 2C, the first electrode NA and the second electrode NB are arranged alternately in each of METAL2 and METAL3. Further, such comb-shaped structures are vertically layered. In other words, these METAL2 and METAL3 have substantially the same structure as METAL2 and METAL3 of the comb-shaped capacitive element illustrated with reference to FIG. 1A and FIG. 1B.

In this way, using the planar shield electrodes as the uppermost layer and the undermost layer of the capacitive element allows a shield of the electric field between the electrodes of the capacitive element, and prevents the capacitive coupling which is not intended.

As mentioned above, it is preferred that the capacitive element to be applied to the A/D converters, such as the successive approximation A/D converter and the delta-sigma A/D converter, have sufficient relative precision and low voltage dependence to achieve a desired resolution. In order to achieve these matters, any of a PIP capacitor, an MIM capacitor and a comb-shaped capacitor is used.

However, the PIP capacitor has a problem of not being able to be formed by a standard logic manufacturing process, requiring additional manufacturing steps, which increases a manufacturing cost. As for the MIM capacitor with parallel plate structure, although there is a possibility to reduce a cost by forming electrodes simultaneously with an interconnecting process, the MIM capacitor has a problem of not being able to be formed by a copper wiring process, for example.

In other words, although the comb-shaped capacitor is usually adopted to make a high resolution A/D converter without an additional manufacturing process in the copper wiring process, the comb-shaped capacitor has problems illustrated in detail below ([first problem] to [third problem]).

[First Problem]

First, the comb-shaped capacitor has a problem that the relative accuracy thereof is inferior in comparison with the PIP capacitor and the MIM capacitor. In other words, the PIP capacitor and the MIM capacitor can be manufactured to be relatively uniform since these capacitors have a simple structure of parallel plates, but the comb-shaped capacitor has a complicated structure and ununiformity is easy to arise, which causes a deterioration of relative accuracy.

Figure 3:
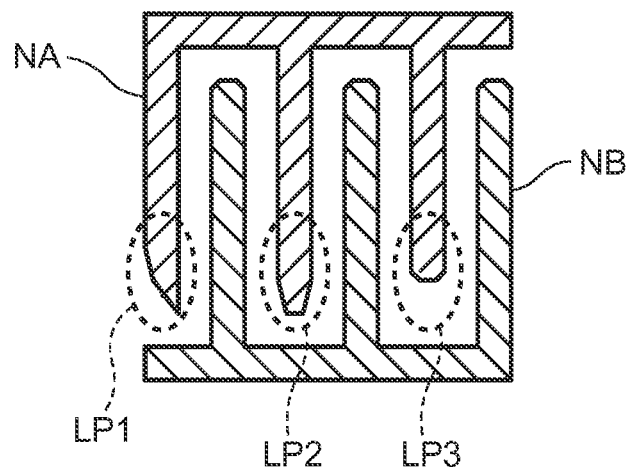
FIG. 3 is a drawing depicting an example of shapes of electrode ends in the comb-shaped capacitive element.

FIG. 3 is a drawing depicting an example of shapes of electrode ends in the comb-shaped capacitive element. FIG. 3 schematically depicts the state of defects actually formed at the ends of the electrode which corresponds to the electrode ends in the comb-shaped capacitive element depicted in FIG. 1A and FIG. 2B. Although FIG. 3 only depicts the state of defects at the ends of the first electrode NA, it is needless to say that the defects may also occur at the ends of the second electrode NB.

The inventors of the present application have noticed that the mismatch in the comb-shaped capacitor is mainly caused by the defects at the ends of the electrodes which form the comb-shaped capacitive element. In other words, as depicted in FIG. 3, in the actual pattern which is formed by alternately arranging the first electrode NA and the second electrode NB, the inventors have found that the defects as indicated by reference marks LP1 to LP3 arise at the ends of the electrodes, for example.

There are a number of ends in the electrode of the comb-shaped capacitive element, and it can be considered that the ends of the electrode become defective parts, for example, in the process of trench formation or planarization (CMP: Chemical Mechanical Polishing).

For example, when the degree of the defects which arise at the ends of the electrode is uniform regardless of positions, the relative accuracy of the capacitive element does not deteriorate. However, for example, the defects which arise during the planarization depend on the positions and size of particles of polish, and therefore the degree of defects is random and does not become uniform. Further, the current wiring width is microscopic such as tens of nm, and it is difficult to form the ends uniformly.

[Second Problem]

In addition, the comb-shaped capacitor has a problem that an electric field passing through a substrate changes the potential distribution of the substrate that makes the voltage dependence of the capacitor appear. The voltage dependence of the capacitive element influences the linearity of the A/D converter, and causes a deformation.

Figure 4:
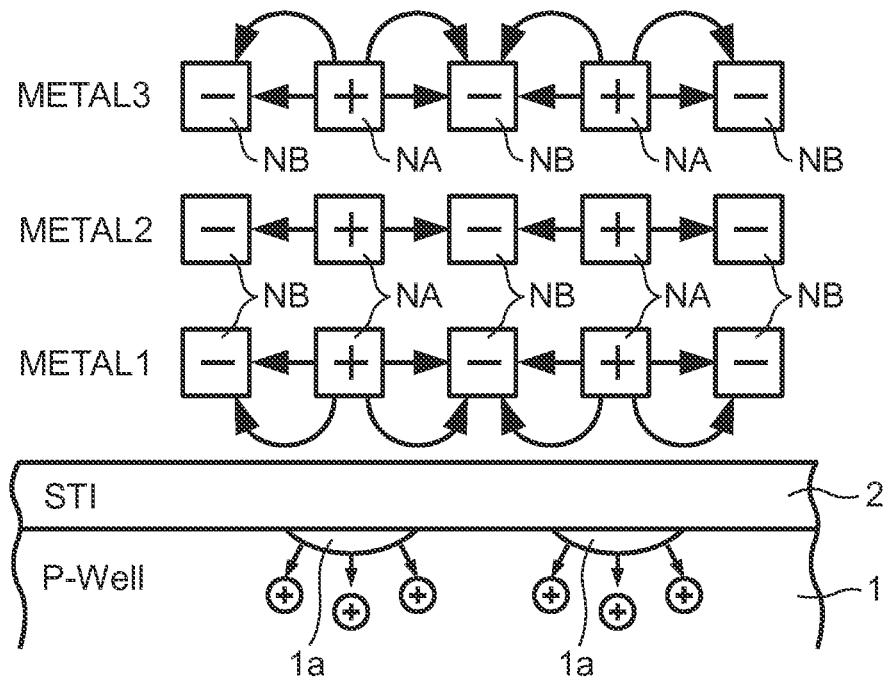
FIG. 4 is a drawing for illustrating the voltage dependence in the comb-shaped capacitive element.

FIG. 4 is a drawing for illustrating the voltage dependence in the comb-shaped capacitive element, and corresponds to what depicts the wiring layers METAL1 to METAL5 in FIG. 1A mentioned above with a semiconductor substrate.

In FIG. 4, the reference mark 1 depicts a P-type well region (P-Well) formed in the semiconductor substrate, 2 depicts an element insulation oxide film (STI: Shallow Trench Insulation), and descriptions of "+" and "−" respectively depict the relative relation of the electric potential between electrodes (NA, NB).

As depicted in FIG. 4, for example, in the comb-shaped capacitive element illustrated with reference to FIG. 1, the electric field is generated from the positive (+) electrode to the negative (−) electrode, and by the electric field P-type well region 1 is slightly depleted in the area indicated by 1a, for example.

As a result, the capacitance between the positive (+) electrode and the negative (−) electrode through P-type well region 1 decreases among the capacitive coupling from the positive (+) electrode to the negative (−) electrode. Such decrease of the capacitance is to be observed as the voltage dependence of the capacitive element. It could be also considered that the voltage dependence of the capacitive element occurs by a mechanism similar to the CV characteristics of a gate capacitance of a MOS transistor.

In other words, the part formed by the capacitive element and the bulk section depicted in FIG. 4 can be regarded as a structure by METAL1—an oxide film 2—silicon (P-type well region 1), therefore as an MOS structure. It is difficult to avoid the above-described negative effect by the bulk section as long as a bulk MOS process is employed, even when the ground of the capacitive element is not P-type well region 1.

Note that the problem of the voltage dependence mentioned above is avoidable, when the undermost layer (METAL1) is made into a shield layer, as is the case with the capacitive element illustrated with reference to FIG. 2A to FIG. 2C, for example. However, as mentioned above, it is difficult to form a planar shield electrode with a large area by the latest copper wiring process.

[Third Problem]

Figure 5:
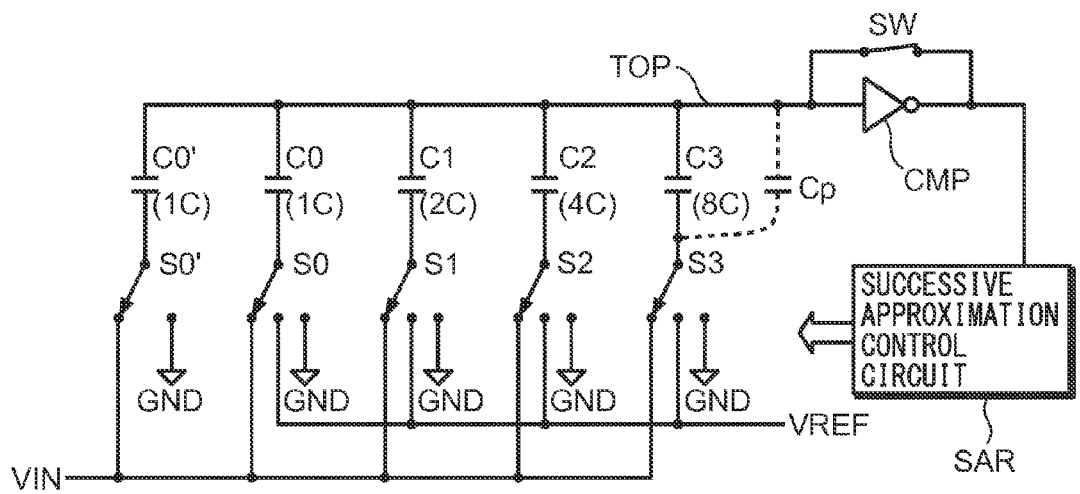
FIG. 5 is a block diagram depicting an example of a successive approximation A/D converter.

Further, the requirements regarding an arrangement of the capacitive elements applied to an A/D converter will be illustrated, and a problem of a conventional arrangement of a comb-shape structured capacitor will be described. FIG. 5 is a block diagram depicting an example of the successive approximation A/D converter.

The successive approximation A/D converter depicted in FIG. 5 is a circuit which obtains an A/D conversion result by sampling an input analog voltage input into a node VIN, comparing the input analog voltage with the output voltage of a capacitor DAC, and searching an output of the capacitor DAC where the two voltages come most closely each other.

In FIG. 5, reference marks C0', C0, C1, C2 and C3 depict capacitive elements, 1C, 2C, 4C, and 8C in the parentheses attached to respective capacitive elements depict the relative relation of the capacitance values. In other words, the capacitance value (relative capacitance value) of the capacitive elements C0' and C0 is set to 1C, and the capacitance values of capacitive elements C1, C2, and C3 are set to values which are power of two (2C, 4C, and 8C), respectively.

Moreover, the reference mark VIN depicts the input analog voltage and the node for such input (input node), VREF depicts a reference voltage and a node thereof (reference node), and GND depicts a ground potential and a node thereof (ground node).

Further, TOP depicts a top plate of a capacitor D/A converter (DAC), and SW, S0', S0, S1, S2 and S3 depict switches. CMP depicts a comparator, and SAR depicts a successive approximation control circuit. Note that Cp depicts a parasitic capacitance which is not intended, and will be used in a later illustration.

As depicted in FIG. 5, in the successive approximation A/D converter, the capacitor DAC includes the capacitive elements C0' and C0 to C3, and each one of the electrodes (nodes) of the binary weighted capacitive elements C0' and C0 to C3 (with relative capacitance of power of two) is common to the top plate TOP.

A capacity ratio of the binary weighted capacitive elements is a prime number, and therefore preparing unit capacitors with a single capacitance value and adjusting the number of parallel connection enable an establishment of a relative relation which is relatively accurate. Note that, since the accuracy of the A/D conversion mainly depends on the relative accuracy of the capacitive elements, it is preferred to arrange the capacitive elements as close as possible each other and it is reasonable to arrange the capacitive elements in an array form.

On the other hand, the switches S0', S0 to S3 provided at lower ends of capacitive elements are realized by MOS transistors, for example, but it is difficult to arrange the switches in the capacitor array. Therefore, when the switches S0' and S0 to S3 realized by the MOS transistors are arranged outside the capacitor array, capacitive element and switch is connected by wiring respectively.

Specifically, as depicted in FIG. 5, when the capacitive elements C0' and C0 to C3 are arranged in the array form, a total of six interconnections are formed which includes interconnections from the lower ends of five capacitive elements C0' and C0 to C3 to corresponding switches S0' and S0 to S3 and an interconnection to the top plate TOP. Note that the example depicted in FIG. 5 requires only six interconnections since the resolution is 4 bits, however the number of interconnections increases as the resolution increases and this causes congestion.

Further, when the parasitic capacitance (Cp in FIG. 5) arises between the lower end electrode (a connection node of C3 and S3) of the capacitive element C3 and the top plate TOP, for example, the relative relation of the capacitance values is destroyed, which deteriorates the accuracy of the A/D conversion. Therefore, as for such parasitic capacitance Cp, it is preferred to make it as small as possible.

However, since the capacitive element with the comb-shape structure mentioned above utilizes a lateral electric field, the parasitic capacitance is easy to arise and there is a possibility of deteriorating the relative relation in the capacitive elements of the capacitor DAC. Note that the above illustration is made mainly for the successive approximation A/D converter, but similar capacitor array may be applied to a delta-sigma A/D converter, for example.

Figure 6:
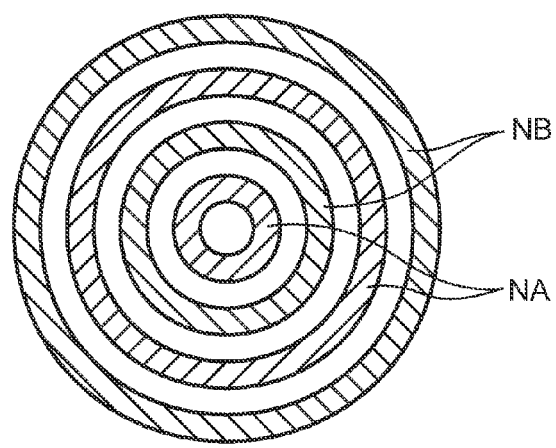
FIG. 6 is a drawing for illustrating an example of the capacitive element according to a present embodiment which solves a first problem.
Figure 7:
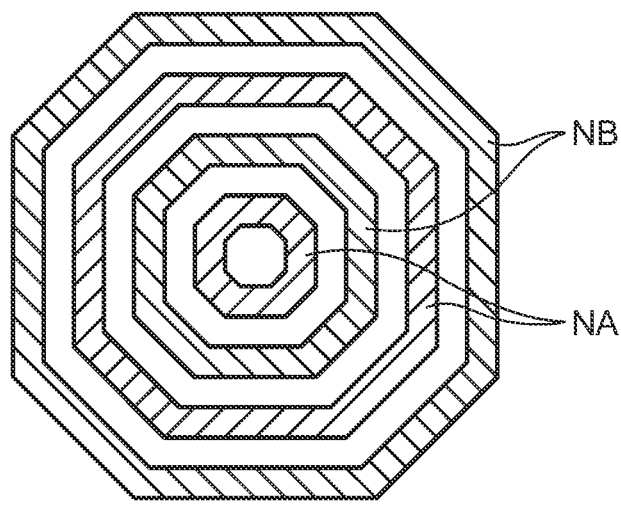
FIG. 7 is a drawing for illustrating another example of the capacitive element according to the present embodiment which solves the first problem.

Hereinafter, embodiments of the capacitive element, the capacitor array, and the A/D converter will be illustrated in detail with reference to accompanying drawings. FIG. 6 is a drawing for illustrating an example of the capacitive element according to a present embodiment which solves the first problem. FIG. 7 is a drawing for illustrating another example of the capacitive element according to the present embodiment which solves the first problem.

As depicted in FIG. 6 and FIG. 7, the first problem illustrated with reference to FIG. 3 is solved by forming the capacity electrode in a closed loop form in which electrodes are arranged in a form of a concentric circle or a concentric polygon to at least one wiring layer provided on or above the substrate. In FIG. 6 and FIG. 7, the reference mark NA indicates the first electrodes (one node of the capacitive element), and NB indicates the second electrodes (another node of the capacitive element).

First, in the capacitive element depicted in FIG. 6, first electrodes NA and second electrodes NB have the closed loop form respectively, and are alternately arranged in a concentric form. By forming a closed loop form in this way, in which capacity electrodes NA and NB are arranged in concentric circular form, it is possible, for example, to eliminate the ends of electrode which causes the problem in the comb-shaped capacitive element illustrated with reference to FIG. 3.

In other words, the capacitive element depicted in FIG. 6 can exclude an influence of the defects possibly arising at the ends of the capacity electrodes, and the capacitive element can be formed uniformly. This enables an accurate formation of the capacitor DAC (capacitor array) used inside the A/D converter, for example.

In addition to non-existence of the ends, there is no vertex in the capacitive element depicted in FIG. 6. In other word, the angular vertex part would be a factor of unevenness in completion of the electrode, though not as critical as the ends, but the present embodiment can eliminate such angular vertex part.

Although in FIG. 6 a perfect circle is depicted as a concentric circle, the concentric circle may be an ellipse and may be a curved shape which is deformed.

Next, as for the capacitive element depicted in FIG. 7, the first electrodes NA and the second electrodes NB are alternately arranged in the concentric polygon form. By arranging the capacity electrodes NA and NB in the concentric polygon form, it is possible, for example, to eliminate the ends of electrodes which cause a problem with the comb-shaped capacitive element illustrated with reference to FIG. 3.

In other words, the capacitive element depicted in FIG. 7 can exclude an influence of the defects possibly arising at the ends of the capacity electrodes as is the case with the capacitive element depicted in FIG. 6, and the capacitive element can be formed uniformly.

The capacitive element depicted in FIG. 7 is made to be a concentric octagon shape. Although a vertex part (for example, the part with angle of 135 degrees) remains, it is possible to improve the relative relation of the capacitance value significantly in comparison with the comb-shaped capacitive element mentioned above, as is the case with the capacitive element of FIG. 6.

Although in FIG. 7 a concentric octagon form is depicted, for example, it is possible to use a concentric quadrangular form, a concentric hexagon form, a concentric decagon form, and so on. Further, it may change (deform) the form itself as long as the form is in the concentric form.

In this way, according to the capacitive element depicted in FIG. 6 and FIG. 7, by arranging two electrodes NA and NB alternately in the concentric form, it is possible to achieve a uniform capacitance, and to realize a capacitive element with a high relative accuracy.

Figure 8:
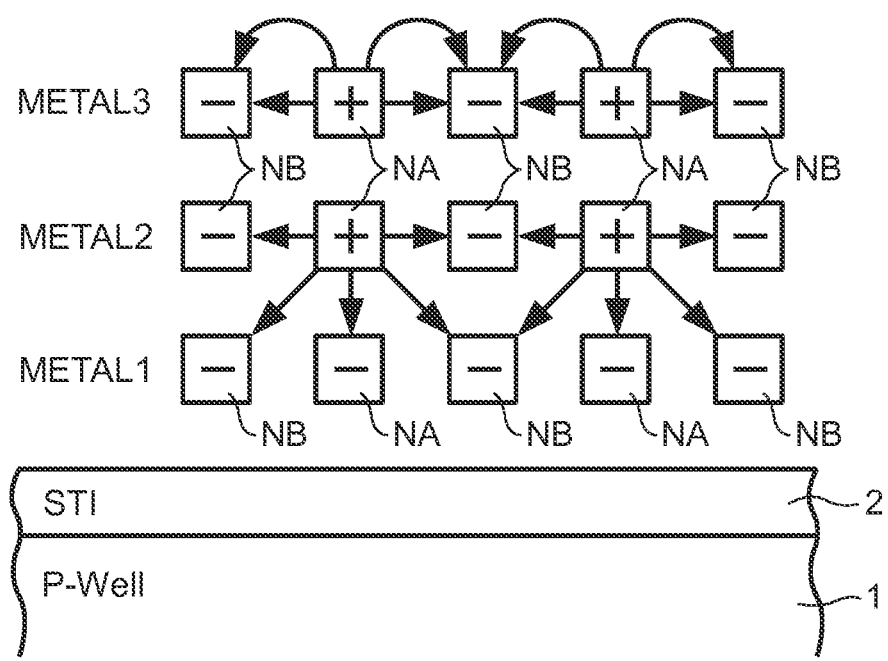
FIG. 8 is a drawing for illustrating an example of the capacitive element according to the present embodiment which solves a second problem.

FIG. 8 is a drawing for illustrating an example of the capacitive element according to the present embodiment which solves the second problem. The capacitive element is formed to prevent a leak of the electric field therein outside the element. In other words, in the capacitive element depicted in FIG. 8, the first and second electrodes (both nodes) NA and NB of the capacitive element are set in negative (−), as for the undermost layer (METAL1) of the capacitive element.

As is clear from the comparison between FIG. 8 and the above-mentioned FIG. 4, the capacitive element depicted in FIG. 8 is formed to prevent a leak of an electric field to outside by applying the negative potential (−) to both electrodes NA and NB in the wiring layer METAL1 which is located just above the element insulation oxide film (STI) 1.

Thereby, the electric field in the capacitive element prevents the change of the potential structure (for example, generation of depletion region 1a in FIG. 4) in the P-type well region (P-Well: semiconductor substrate) 1, and the voltage dependence of the capacitive element can be reduced.

In the capacitive element depicted in FIG. 8, the undermost layer METAL1 of the capacitive element illustrated with reference to FIG. 2A to FIG. 2C is not used as a planar shield electrode, but the undermost layer is formed to be the same electrode pattern as upper layers METAL2 and METAL3. Thereby, it can easily form also by a copper wiring process. Note that it is needless to say that the first electrode NA and the second electrode NB in the undermost layer METAL1 may be set as positive (+) not negative (−).

Figure 9A:
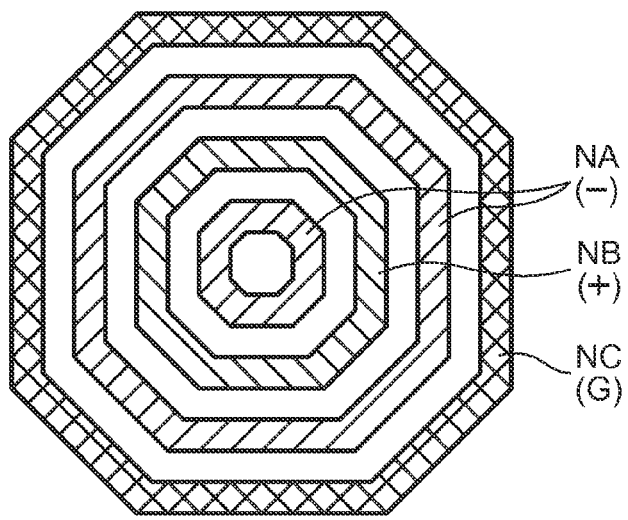
FIG. 9A, FIG. 9B, and FIG. 9C are drawings for illustrating an example of the capacitive element according to the present embodiment which solves the third problem.
Figure 9B:
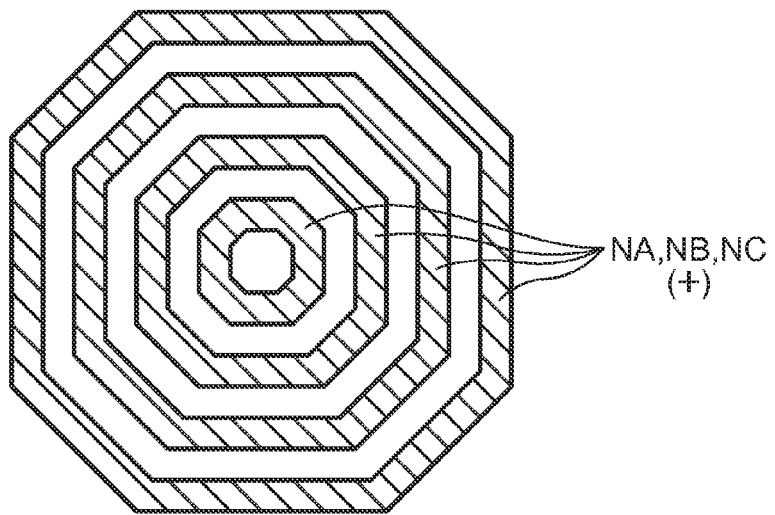
Figure 9C:
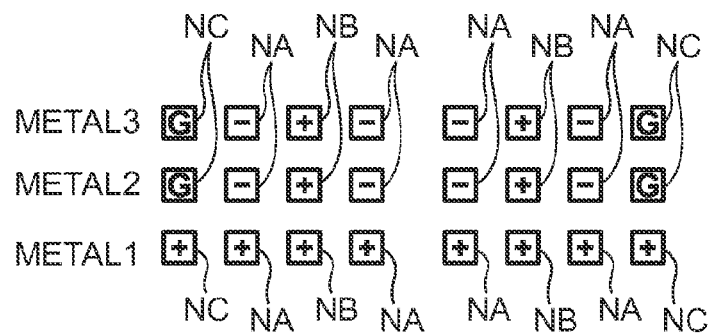

FIG. 9A, FIG. 9B, and FIG. 9C are drawings for illustrating an example of the capacitive element according to the present embodiment which solves the third problem. FIG. 9A depicts a top view of upper two wiring layers METAL2 and METAL3, FIG. 9B depicts a top view of the undermost layer METAL1, and FIG. 9C depicts a cross-sectional view. A reference mark G depicts a ground node (GND).

First, as depicted in FIG. 9A and as illustrated with reference to FIG. 7, two electrodes (positive (+) and negative (−)) are arranged alternately in the concentric polygon form in the capacitive element according to the present embodiment, so that the first problem mentioned above can be solved. The outermost electrode NC among the electrodes arranged in a concentric polygon form is used as the ground node G.

Further, as depicted in FIG. 9C and as illustrated with reference to FIG. 8, in the capacitive element according to the present embodiment, a positive (+) potential is applied to all the electrodes NA, NB and NC of the undermost layer METAL1 to prevent a leak of an electric field to outside. In other words, the second problem mentioned above can be solved.

Note that, the positive (+) potential is applied to all the electrodes NA, NB and NC of the undermost layer METAL1 in FIG. 9C, which is the same as applying a negative (−) potential as depicted in FIG. 8. Moreover, the electrode NA, NB and NC are made to be the octagon, but as mentioned above, the electrodes may be the concentric polygon or the concentric circle.

Further, in FIG. 9C, as for the electrodes NA and NB, the same electrodes are arranged in the thickness direction of the substrate of the wiring layers METAL2 and METAL3, for example, but reversed electrodes (nodes) may be arranged. In other words, in the wiring layer METAL3, the electrode NB may be arranged in the position corresponding to the electrode NA of the wiring layer METAL2, and the electrode NA may be arranged in the position corresponding to the electrode NB of the wiring layer METAL2. Thereby, it is possible to form a capacitor between the electrodes NA and NB in the thickness direction.

The unit capacitors (for example, the capacitor C0' and C0 to C3 in FIG. 5) are made to be the above-mentioned structures, and the structures are arranged on the same plane to form a capacitor array. As for the common electrode (top node TOP in FIG. 5) of the capacitor array included in the A/D converter, wiring is completed by connecting neighboring capacitors using the wiring layer METAL1.

Further, wirings between the capacitors and the outer electrode NA to which the negative (−) potential is applied are shielded by the electrode NC of the ground node G arranged at the wiring layers METAL2 and METAL3. Thereby, the relative relation of the capacitive elements does not deteriorate.

As described above, according to the capacitive element of the present embodiment, it is possible to form the capacitive element suitable for a copper wiring process which is used widely in recent years, to improve the relative accuracy, and to reduce the voltage dependence of the capacitor.

According to the A/D converter of the present embodiment, it is possible to accurately form the capacitor array which is to be applied to the capacitor DAC used inside the A/D converter. As a result, it is possible to achieve the A/D converter with high precision.

Figure 10:
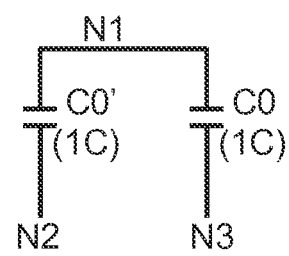
FIG. 10 is a circuit diagram depicting one embodiment of the capacitive element.

FIG. 10 is a circuit diagram depicting one embodiment of the capacitive element, and corresponds to a circuit from which two capacitors C0' and C0 in FIG. 5 mentioned above are extracted. In other words, in FIG. 10, reference marks C0' and C0 depict the capacitive elements, and description of 1C attached to each capacitive element depicts the relative relation of a capacitance value.

Moreover, reference mark N1 depicts the common node (one electrode of each of capacitive elements C0' and C0: top plate TOP) of the circuit, and N2 and N3 depict the other node (the other electrode: bottom plate) of each of the capacitive elements C0' and C0.

FIG. 11A, FIG. 11B, FIG. 11C, FIG. 11D, FIG. 11E, and FIG. 11F are drawings for illustrating the capacitive element depicted in FIG. 10, and for illustrating layout structures of two capacitive elements C0' and C0 depicted in FIG. 10. In FIG. 11A to FIG. 11F, reference mark METAL1 depicts a first wiring layer from the substrate side, METAL2 depicts a second wiring layer therefrom, METAL3 depicts a third wiring layer therefrom, and similarly, METAL6 indicates a sixth wiring layer therefrom. GND depicts a node connected to ground potential.

FIG. 11A to FIG. 11E depict the top views of each of wiring layers METAL6 to METAL1, respectively, and FIG. 11F depicts a cross-sectional view. As depicted in FIG. 11C, the top view of the wiring layers METAL4 and METAL3 is made to be the same shape.

In the circuit depicted in FIG. 10, the capacitive elements C0' and C0 have the same capacitance value (1C), and it is not preferred that the balance of the capacitances is lost, for example, due to a parasitic capacitance. Each of the nodes (electrode) N1, N2 and N3 of respective capacitive elements is interconnected with corresponding switch arranged outside the capacitor array, for example.

In FIG. 11A to FIG. 11F, the electrodes of the wiring layers METAL1 to METAL4 are arranged in an octagon shape and in concentric form. By employing such a structure, it is possible to avoid the influence of the defects which arise at the ends of electrode of the comb-shaped capacitive element illustrated with reference to FIG. 3, for example.

Since the undermost wiring layer METAL1 is a common node N1, the electric field in the capacitive element does not affect the substrate (silicon substrate). Therefore, the electrical change inside the substrate does not appear as the voltage dependence of the capacitance value.

The outermost circumference of the wiring layers METAL3 and METAL4 and the outermost and the second outermost circumference of the wiring layer METAL2 are fixed to GND potential, and the electric field inside the element is shielded.

In other words, fixing the outermost and the second outermost circumference of the wiring layer METAL2 to GND potential causes, for example, a shield of coupling of the node N2 in the capacitive element C0' and the common node N1 in the vertical (thickness) direction, and also causes a shield of coupling of the node N3 in the capacitive element C0 and the common node N1 in the lengthwise direction.

Thereby, even when the common node N1 of the capacitive elements C0' and C0 is connected to the undermost wiring layer METAL1, the parasitic capacitance which is not intended does not arise.

The wiring layer METAL5 is a node which collects the node N2 of the capacitive element C0', or the node N3 of the capacitive element C0, which prevents capacitive coupling of wiring between the nodes N2 and N3 arranged in the wiring layer METAL6 in the capacitive element.

As illustrated in detail above, by applying the present embodiment, it becomes possible to realize the capacitor array to be included in an A/D converter, without using an electrode with wide width which is difficult to be formed by the current copper wiring process.

Figure 12A:
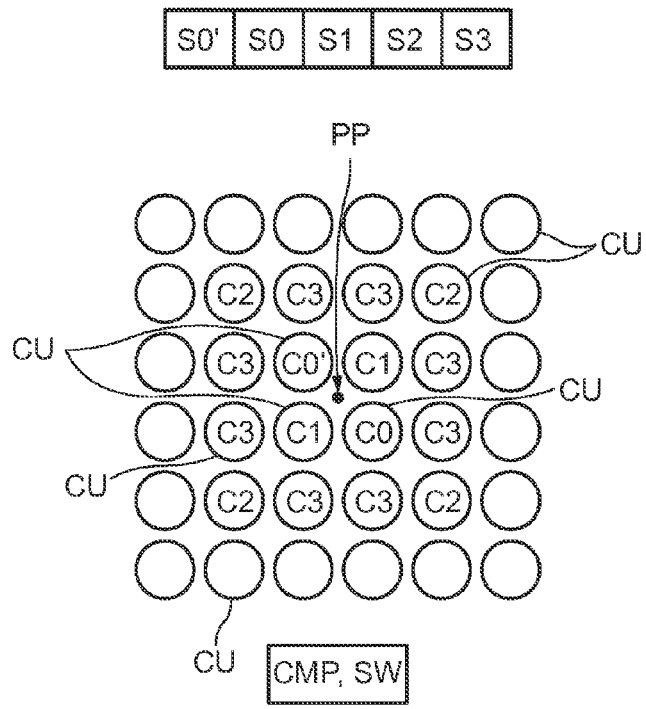
FIG. 12A, FIG. 12B, and FIG. 12C are drawings for illustrating one embodiment of a capacitor array.
Figure 12B:
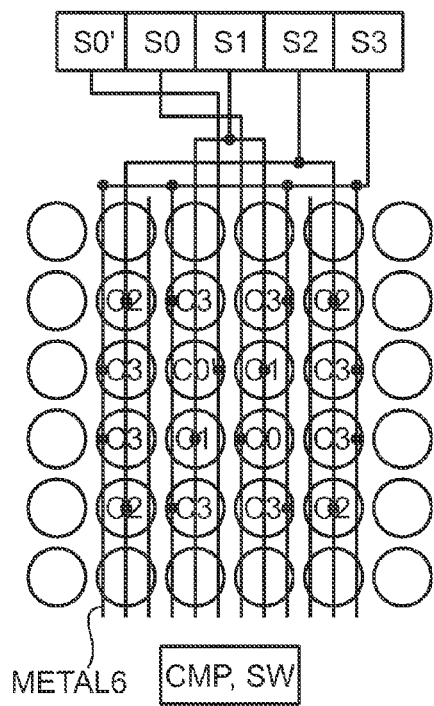
Figure 12C:
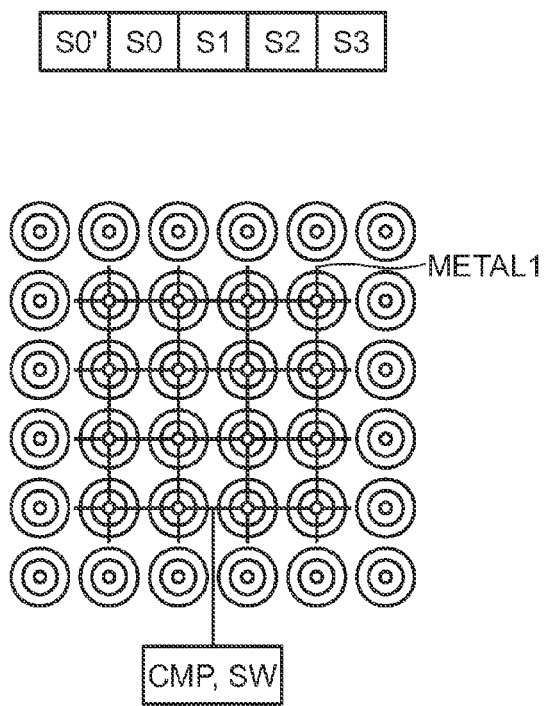

FIG. 12A, FIG. 12B, and FIG. 12C are drawings for illustrating one embodiment of the capacitor array. FIG. 12A, FIG. 12B, and FIG. 12C depict a mutual interconnection example of the capacitor array of a 4-bit successive approximation A/D converter illustrated with reference to FIG. 5.

FIG. 12A depicts an arrangement of switches SW, S0', S0 to S3, a comparator CMP and capacitive elements C0' and C0 to C3, FIG. 12B depicts the connection in the wiring layer METAL6, and FIG. 12C depicts the connection in the wiring layer METAL1.

In FIG. 12A to FIG. 12C, reference mark CU depicts a unit capacitor (a relative capacitance value is a capacitance 1C), METAL1 to METAL6 depict respective layer numbers of the wiring layers, and C0', C0, C1, C2 and C3 depict the capacitive element. Note that the capacitive element C0' and C0 to C3 correspond to the capacitive element C0' and C0 to C3 of the successive approximation A/D converter depicted in the above-mentioned FIG. 5.

First, as depicted in FIG. 12A, the switches S0', S0, S1, S2 and S3, a plurality of unit capacitors CU (capacitive elements C0', C0, C1, C2, and C3) arranged in the array form, the comparator CMP, and the switch SW are arranged (formed) on a semiconductor substrate.

The switches S0', S0, S1, S2 and S3 are arranged at periphery parts of the plurality of unit capacitors CU (capacitive elements C0', C0, C1, C2, and C3) arranged in the array form. The comparator CMP and the switch SW are arranged at periphery parts of the plurality of unit capacitors CU (capacitive elements C0', C0, C1, C2, and C3) arranged in the array form.

In the example of FIG. 12A, the unit capacitors (white pattern in FIG. 12A) of the outermost circumference of the plurality of unit capacitors CU (capacitor array) arranged in the array form are dummy unit capacitors, which are not used as the capacitive elements C0' and C0 to C3.

Moreover, the unit capacitors CU used as the capacitive element C0' and C0 to C3 are selected so that the unit capacitors are distributed for each capacitive element. Specifically, in FIG. 12A, except for the capacitances C0' and C0, the unit capacitors CU in the positions of point symmetry to a central point PP are selected for the capacitive elements C1, C2 and C3.

In this way, by considering a selection of the unit capacitors CU used as the capacitive elements C0' and C0 to C3, it becomes possible to bring the relative relation of the capacitance values of respective capacitive elements close to ideal relation. Note that the arrangement depicted in FIG. 12A is a mere example, and it is needless to say that other various arrangements may be applied.

Further, as depicted in FIG. 12C, for example, as for the capacitive elements C0', C0, C1, C2 and C3, one node of each capacitive element is commonly connected by an wiring with the undermost wiring layer METAL1 to be the top plate TOP. Note that a connection of the top plate TOP with the comparator CMP and the switch SW can also be made by the wiring with the wiring layer METAL1.

In this way, the top plate TOP for each of capacitive elements C0' and C0 to C3 is formed by merely connecting the electrodes of neighboring unit capacitors, for example, using the wiring of the undermost wiring layer METAL1.

As depicted in FIG. 12B, the capacitive elements C0' and C0 are formed by one unit capacitor (CU×1=1C), and the capacitive element C1 is formed by two unit capacitors (CU×2=2C). Moreover, the capacitive element C2 is formed by four unit capacitors (CU×4=4C), and the capacitive element C3 is formed by eight unit capacitors (CU×8=8C).

In other words, as depicted in FIG. 12B, the capacitance values of capacitive elements C0', C0, C1, C2 and C3 are determined by the number of connections (one piece, two pieces, four pieces and eight pieces) which correspond with the unit capacitors CU by the wiring in the wiring layer METAL6.

Further, other node (bottom plate) of capacitive elements C0', C0, C1, C2 and C3 of which relative capacitance value is determined is connected to corresponding switches S0' and S0, S1, S2 and S3, for example, by using the uppermost wiring layer METAL6.

Bottom plate wiring (interconnection of switches S0' and S0 to S3 which correspond with capacitive elements C0' and C0 to C3) of the capacitor array using the wiring layer METAL6 may be arranged redundantly, and a designated spot may be contacted by a via. Thus, the shape of the uppermost layer of all the capacitive elements can be common, and it becomes possible to set the relative relation of the capacitance values of respective capacitive elements with higher accuracy.

In this way, for example, the successive approximation A/D converter depicted in FIG. 5 can be formed. Since it is possible to set the relative relation of the capacitance values of the capacitive elements C0' and C0 to C3 with higher accuracy and each wiring becomes monotonous, it can be expected to further improve the A/D conversion characteristic.

Figure 13:
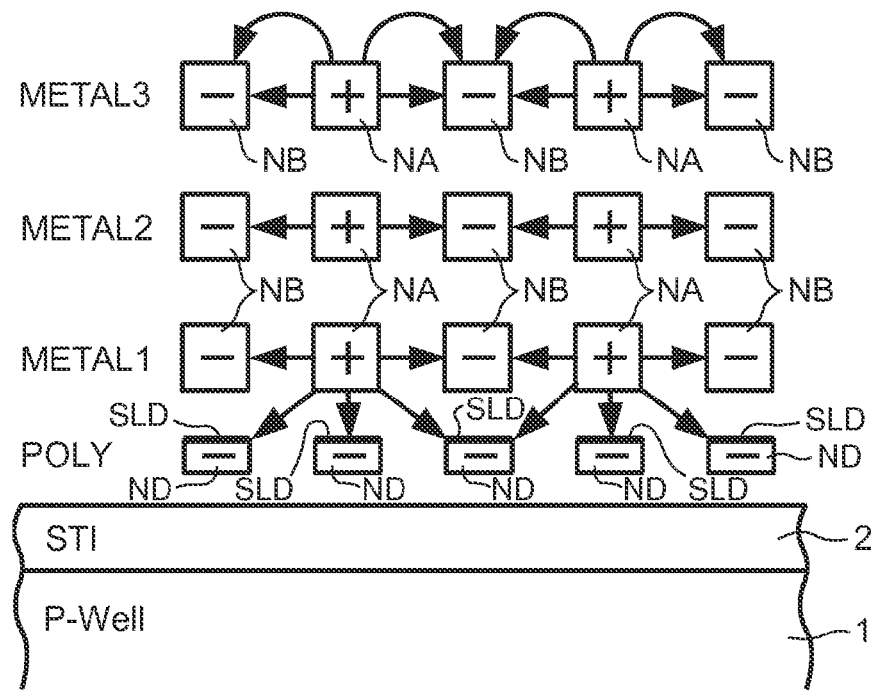
FIG. 13 is a drawing for illustrating one modification of the capacitive element.

FIG. 13 is a drawing for illustrating one modification of the capacitive element. In FIG. 13, reference mark POLY depicts a polysilicon layer, ND depicts the electrode (node) formed with polysilicon, and SLD depicts that the surface of the polysilicon electrode ND is silicidated. Note that other reference marks are the same as what are depicted in FIG. 8 mentioned above.

The polysilicon layer POLY is a conductive layer used as a gate electrode of a transistor formed on the semiconductor substrate in a general MOS process. In the present modification, the polysilicon layer POLY is used instead of the wiring layer METAL1 which prevents a leak of the electric field to outside in the capacitive element depicted in FIG. 8.

According to the modification depicted in FIG. 13, it is possible to use the wiring layer METAL1 as a capacity electrode for actually accumulating an electric charge, and it becomes possible to increase the capacitance value per unit area.

Figure 14:
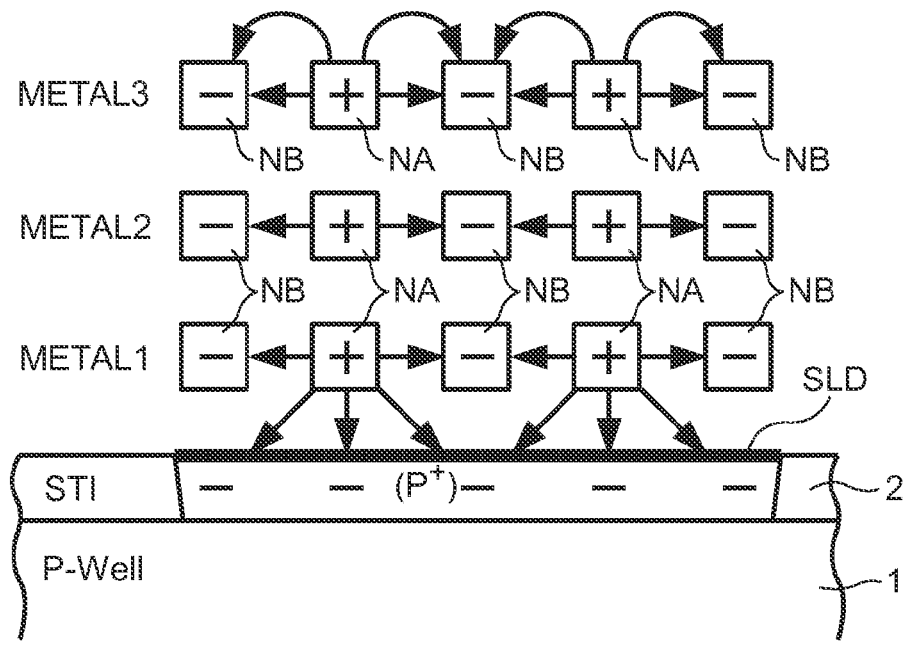
FIG. 14 is a drawing for illustrating another modification of the capacitive element.

FIG. 14 is a drawing for illustrating another modification of the capacitive element. In FIG. 14, reference mark $P^+$ depicts a highly-concentrated P-type diffusion region, and SLD depicts that the surface of a diffusion region is silicidated. Note that other reference marks are the same as what are depicted in FIG. 8 mentioned above.

In the modification depicted in FIG. 14, for example, an impure substance is doped to a silicon substrate to make an impurity region (for example, highly-concentrated P-type diffusion region $P^+$), and the silicidation (SLD) is performed on the surface. By this, silicidated surface SLD is used as a shield layer by the wiring layer METAL1 illustrated with reference to FIG. 2A to FIG. 2C, for example.

In this way, the shield electrode for preventing the leak of the electric field in the capacitive element to outside can be formed also by the diffusion region or the metallized (silicidated) surface.

According to the modification depicted in FIG. 14, as is the case with the modification in FIG. 13 mentioned above, it is possible to use the wiring layer METAL1 as the capacity electrode for actually accumulating the electric charge, and it becomes possible to increase the capacitance value per unit area.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A capacitive element comprising:
a first terminal;
a second terminal;
first electrodes and second electrodes that are alternately arranged in a concentric form in a plurality of wiring layers provided on or above a substrate, each of the first electrodes and the second electrodes being formed with closed loop form, wherein
the first electrodes and the second electrodes are formed in corresponding positions in the plurality of wiring layers,
the first electrodes and the second electrodes are both connected to one of the first terminal and the second terminal in a first wiring layer of the plurality of wiring layers, the first wiring layer being an undermost wiring layer at a substrate side among the plurality of wiring layers, and
the first electrodes and the second electrodes are connected to the first terminal and the second terminal, respectively, in a second wiring layer of the plurality of wiring layers, the second wiring layer being above the first wiring layer, each of the first electrodes and a corresponding one of the second electrodes that is adjacent to the each of the first electrodes being capacitively coupled in the second wiring layer to form a capacitor.

2. The capacitive element according to claim 1, wherein the first wiring layer is a polysilicon layer formed above the substrate and polysilicon electrodes of transistors formed on the substrate are used as the first electrodes and the second electrodes in the first wiring layer.

3. The capacitive element according to claim 1, the capacitive element comprising:
an impurity region formed in the substrate under the first wiring layer and including a silicidated region to which one of the first terminal and the second terminal is connected.

4. The capacitive element according to claim 1, wherein a fixed potential is applied at least to an outermost electrode among the first electrodes and the second electrodes alternately arranged in the concentric form.

5. The capacitive element according to claim 1, wherein the concentric form is a concentric circular form or a concentric polygon form.

6. The capacitive element according to claim 1, wherein the first electrodes and the second electrodes are formed in a copper wiring process.

7. The capacitive element according to claim 1, wherein each of the first electrodes and the second electrodes includes no end.

8. A capacitor array including a plurality of unit capacitors arranged in an array form, and defining the number of the unit capacitors used as each of a plurality of capacitive elements in accordance with a relative ratio of capacitance values of the plurality of capacitive elements, the capacitor array comprising:
a first wiring layer which connects the plurality of capacitive elements to a common electrode; and
a second wiring layer which connects the unit capacitors used for each of the plurality of capacitive elements, wherein
each of the plurality of unit capacitors includes:
a first terminal;
a second terminal;
first electrodes and second electrodes that are alternately arranged in a concentric form in a plurality of wiring layers provided on or above a substrate, each of the first electrodes and the second electrodes being formed with closed loop form, wherein
the first electrodes and the second electrodes are formed in corresponding positions in the plurality of wiring layers,
the first electrodes and the second electrodes are both connected to one of the first terminal and the second terminal in a third wiring layer of the plurality of wiring layers, the third wiring layer being an undermost wiring layer at a substrate side among the plurality of wiring layers, and
the first electrodes and the second electrodes are connected to the first terminal and the second terminal, respectively, in a fourth wiring layer of the plurality of wiring layers, the fourth wiring layer being above the third wiring layer, each of the first electrodes and a corresponding one of the second electrodes that is adjacent to the each of the first electrodes being capacitively coupled in the fourth wiring layer to form a capacitor.

9. The capacitor array according to claim 8, wherein the unit capacitor arranged at an outermost circumference of the capacitor array is a dummy capacitor which is not used as a unit capacitor to be used for the plurality of capacitive elements.

10. The capacitor array according to claim 8, wherein the unit capacitors arranged in distributed positions in the capacitor array are selected as the unit capacitors used for each of the plurality of capacitive elements.

11. The capacitor array according to claim 8, wherein the first wiring layer is an undermost wiring layer at a substrate side, and
the second wiring layer is an uppermost wiring layer above a substrate.

12. The capacitor array according to claim 8, wherein a fixed potential is applied at least to an outermost electrode among the first electrodes and the second electrodes alternately arranged in the concentric form.

13. The capacitor array according to claim 8, wherein the first electrodes and the second electrodes are formed in a copper wiring process.

14. The capacitor array according to claim 8, wherein each of the first electrodes and the second electrodes includes no end.

15. An A/D converter comprising:
a capacitor array including a plurality of unit capacitors arranged in an array form, and defining the number of the unit capacitors used as each of a plurality of capacitive elements in accordance with a relative ratio of capacitance values of the plurality of capacitive elements;
a plurality of switches arranged at a periphery of the capacitor array and provided corresponding to the plurality of capacitive elements; and
a comparator arranged at the periphery of the capacitor array and configured to compare input voltage with voltage corresponding to the capacitive elements selected by the plurality of switches, wherein analog-to-digital conversion of the input voltage is performed, and the capacitor array includes:
- a first wiring layer which connects the plurality of capacitive elements to a common electrode; and
- a second wiring layer which connects the unit capacitors used for each of the plurality of capacitive elements, wherein each of the plurality of unit capacitors includes:
- a first terminal;
- a second terminal;
- first electrodes and second electrodes that are alternately arranged in a concentric form in a plurality of wiring layers provided on or above a substrate, each of the first electrodes and the second electrodes being formed with closed loop form, wherein
  - the first electrodes and the second electrodes are formed in corresponding positions in the plurality of wiring layers,
  - the first electrodes and the second electrodes are both connected to one of the first terminal and the second terminal in a third wiring layer of the plurality of wiring layers, the third wiring layer being an undermost wiring layer at a substrate side among the plurality of wiring layers, and
  - the first electrodes and the second electrodes are connected to the first terminal and the second terminal, respectively, in a fourth wiring layer of the plurality of wiring layers, the fourth wiring layer being above the third wiring layer, each of the first electrodes and a corresponding one of the second electrodes that is adjacent to the each of the first electrodes being capacitively coupled in the fourth wiring layer to form a capacitor.

16. The A/D converter according to claim 15, wherein a fixed potential is applied at least to an outermost electrode among the first electrodes and the second electrodes alternately arranged in the concentric form.

17. The A/D converter according to claim 15, wherein the unit capacitor arranged at an outermost circumference of the capacitor array is a dummy capacitor which is not used as a unit capacitor to be used for the plurality of capacitive elements.

18. The A/D converter according to claim 15, wherein the first wiring layer is an undermost wiring layer at a substrate side, and the second wiring layer is an uppermost wiring layer above a substrate.

19. An integrated circuit, comprising:
an A/D converter including:
- a capacitor array including a plurality of unit capacitors arranged in an array form, and defining the number of the unit capacitors used as each of a plurality of capacitive elements in accordance with a relative ratio of capacitance values of the plurality of capacitive elements;
- a plurality of switches arranged at a periphery of the capacitor array and provided corresponding to the plurality of capacitive elements; and
- a comparator arranged at the periphery of the capacitor array and configured to compare input voltage with voltage corresponding to the capacitive elements selected by the plurality of switches, wherein analog-to-digital conversion of the input voltage is performed, and the capacitor array includes:
- a first wiring layer which connects the plurality of capacitive elements to a common electrode; and
- a second wiring layer which connects the unit capacitors used for each of the plurality of capacitive elements, wherein each of the plurality of unit capacitors includes:
- a first terminal;
- a second terminal;
- first electrodes and second electrodes that are alternately arranged in a concentric form in a plurality of wiring layers provided on or above a substrate, each of the first electrodes and the second electrodes being formed with closed loop form, wherein
  - the first electrodes and the second electrodes are formed in corresponding positions in the plurality of wiring layers,
  - the first electrodes and the second electrodes are both connected to one of the first terminal and the second terminal in a third wiring layer of the plurality of wiring layers, the third wiring layer being an undermost wiring layer at a substrate side among the plurality of wiring layers, and
  - the first electrodes and the second electrodes are connected to the first terminal and the second terminal, respectively, in a fourth wiring layer of the plurality of wiring layers, the fourth wiring layer being above the third wiring layer, each of the first electrodes and a corresponding one of the second electrodes that is adjacent to the each of the first electrodes being capacitively coupled in the fourth wiring layer to form a capacitor.

* * * * *